(12) United States Patent
Bartholomew

(10) Patent No.: US 7,658,622 B2
(45) Date of Patent: Feb. 9, 2010

(54) CIRCUIT BOARD HAVING CONFIGURABLE GROUND LINK AND WITH COPLANAR CIRCUIT AND GROUND TRACES

(75) Inventor: Victor L. Bartholomew, Sherwood, OR (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 12/386,592

(22) Filed: Apr. 21, 2009

(65) Prior Publication Data

US 2009/0211088 A1      Aug. 27, 2009

Related U.S. Application Data

(62) Division of application No. 11/502,979, filed on Aug. 11, 2006, now Pat. No. 7,520,757.

(51) Int. Cl.
*H01R 12/00* (2006.01)
(52) U.S. Cl. .................. 439/76.1; 29/846; 361/777
(58) Field of Classification Search ............. 439/76.1, 439/77, 943, 947; 29/825, 829, 846, 847, 29/852; 361/777, 780, 794
See application file for complete search history.

(56) References Cited

U.S. PATENT DOCUMENTS

| | | | |
|---|---|---|---|
| 2,268,813 A | 1/1942 | Foster | |
| 4,854,040 A | 8/1989 | Turek | |
| 4,871,319 A | 10/1989 | Babow | |
| 4,889,497 A | 12/1989 | Riches | |
| 4,947,386 A | 8/1990 | Preschutti | |
| 5,160,374 A | 11/1992 | Frederickson et al. | |
| 5,679,008 A | 10/1997 | Takahashi et al. | |
| 5,766,027 A | 6/1998 | Fogg | |
| 5,971,812 A | 10/1999 | Martin | |
| 6,113,400 A | 9/2000 | Martin et al. | |
| 6,234,807 B1 | 5/2001 | Amini et al. | |
| 6,425,766 B1 | 7/2002 | Panella | |
| 6,431,887 B1 | 8/2002 | Yeomans et al. | |
| 6,612,859 B2 | 9/2003 | Yeomans et al. | |
| 6,614,662 B2 | 9/2003 | Stickler et al. | |
| 6,617,939 B1 | 9/2003 | Vermeersch | |

(Continued)

OTHER PUBLICATIONS

"Printed Circuit Card Wiring Technique", 700 IBM Technical Disclosure Bulletin, Apr. 1989, p. 392-395, vol. 31, No. 11, IBM Corporation, Armonk, NY.

(Continued)

*Primary Examiner*—Thanh-Tam T Le

(57) ABSTRACT

A transition circuit board for transitioning a cable to a connector is provided. A circuit board has an outer surface with a circuit trace, ground plane and ground link provided thereon. A cable pad and a contact pad are provided at opposite ends of the circuit trace. The ground link is electrically common with the ground plane and is located adjacent to, and separated by a space from, the circuit trace. An insulating coating is provided over at least part of the circuit trace, the ground plane and the outer surface of the circuit board. The insulating coating has a mask aperture there-through exposing an uncoated portion of the circuit trace and the ground link. A conductive jumper material is provided on the uncoated portion of the circuit trace and the ground link to electrically join the circuit trace with the ground plane.

8 Claims, 9 Drawing Sheets

U.S. PATENT DOCUMENTS

| | | |
|---|---|---|
| 6,682,368 B2 | 1/2004 | Murr et al. |
| 6,765,298 B2 | 7/2004 | Chin et al. |
| 6,893,270 B2 | 5/2005 | Sercu |
| 7,131,862 B2 | 11/2006 | Vermeersch |
| 7,244,126 B2 | 7/2007 | Morana et al. |
| 7,520,757 B2 * | 4/2009 | Bartholomew ............ 439/76.1 |
| 2007/0187141 A1 | 8/2007 | Bartholomew |

OTHER PUBLICATIONS

International Search Report for International Application No. PCT/US2007/017763, mailed Jan. 17, 2008.

* cited by examiner

CIRCUIT BOARD HAVING CONFIGURABLE GROUND LINK AND WITH COPLANAR CIRCUIT AND GROUND TRACES

CROSS REFERENCE TO RELATED APPLICATIONS

This application is a divisional application of co-pending, commonly assigned U.S. application Ser. No. 11/502,979, filed Aug. 11, 2006, the disclosure of which is incorporated herein by reference. This application is related to U.S. application Ser. No. 11/298,998 filed Dec. 9, 2005, now U.S. Pat. No. 7,244,126, issued Jul. 14, 2007, which is assigned to the same Assignee and is hereby incorporated by reference in its entirety.

BACKGROUND OF THE INVENTION

This invention relates generally to circuit boards, and more particularly, to circuit boards used in connectors to transition one type of cable to another.

Connector transition circuit boards are used in a variety of connector types to convey signals between cables, mother boards, daughter cards, backplanes and the like. For example, one end of the circuit board may be interconnected with one or more coaxial cables and the other end of the circuit board is interconnected with contacts in a connector or pads on a component circuit board. Currently available connector transition circuit boards typically do not have an internal ground reference. Thus, the connector transition circuit board generally forms a non-coaxial board-to-board wire interface. Today, high speed applications have increasing performance requirements and utilize higher and higher signal frequencies. The non-coaxial board-to-board wire interfaces formed in conventional connector transition circuit boards are inadequate for these high speed applications.

Further, existing connector systems with transition circuit boards are used with numerous different configurations of cables and component circuit boards. Each different cable and board configuration may have a unique signal and ground line configuration and a unique cable contact or pin pattern at the connector. Consequently, each different cable to board configuration has a unique signal and ground routing pattern through the connector between the cable and component circuit board. For example, one configuration may designate pins 1 and 10 as ground pins, while a second configuration may designate pins 4 and 20 as ground pins. Also, certain connectors may use insulation displacement contacts to terminate the wires within coaxial cables, while other connectors may not. Heretofore, connectors were designed for a specific application and configuration. It is expensive and undesirable to alter connector systems for each individual application and configuration, to change signal routing, to change pin-out patterns and create custom transition boards for different applications.

Therefore, a need exists for a transition circuit board for connectors that do not otherwise have an internal ground reference and that may be used in systems having different signal routing patterns with respect to each other. Certain embodiments of the present invention are intended to meet these needs and other objectives that will become apparent from the description and drawings set forth below.

BRIEF DESCRIPTION OF THE INVENTION

In one embodiment, a transition circuit board for transitioning a cable to a connector comprises a circuit board having an outer surface. A circuit trace, ground plane and ground link are provided on the outer surface of the circuit board. A cable pad and a contact pad are provided at opposite ends of the circuit trace. The ground link is electrically common with the ground plane and is located adjacent to, and separated by a space from, the circuit trace. An insulating coating is provided over at least a part of the circuit trace, the ground plane and the outer surface of the circuit board. The insulating coating has a mask aperture there-through exposing an uncoated portion of the circuit trace and the ground link. A conductive jumper material is provided on the uncoated portion of the circuit trace and the ground link to electrically join the circuit trace with the ground plane.

In another embodiment, an electrical connector comprises a connector and a circuit board. The circuit board has an outer surface, a cable receiving end and a contact mating end. The cable receiving end is configured to be joined to cables terminated at the circuit board and the contact mating end is configured to engage contacts. A circuit trace, a ground plane, and a ground link are provided on the outer surface of the circuit board. The circuit trace has a cable pad and a contact pad provided at the cable receiving end and contact mating end, respectively. The ground link is electrically common with the ground plane and is located adjacent the circuit trace. An insulating coating is provided over portions of the circuit trace and outer surface of the circuit board. The insulating coating has a mask aperture there-through exposing an uncoated portion of the circuit trace and the ground link. A conductive jumper material is provided on the uncoated portion of the circuit trace and the ground link to render the circuit trace electrically common with the ground plane.

In another embodiment, a method of manufacturing a circuit board for transitioning a coaxial cable to a connector comprises forming a circuit board with at least two layers. A circuit trace is provided on an outer surface of the circuit board and has a cable pad and a contact pad at different ends of the outer surface. A ground plane is provided on the outer surface of the circuit board. The ground plane has a ground link and is coplanar with the circuit trace. At least portions of the circuit trace and the outer surface of the circuit board are coated with an insulating coating. A portion of the circuit trace and the ground link are masked to form an uncoated portion of the circuit trace and the ground link. The circuit trace and the ground link within the uncoated portion are located immediately adjacent to one another.

The foregoing summary, as well as the following detailed description of certain embodiments of the present invention, will be better understood when read in conjunction with the appended drawings. It should be understood that the present invention is not limited to the arrangements and instrumentality shown in the attached drawings.

DETAILED DESCRIPTION OF THE INVENTION

Figure 1:
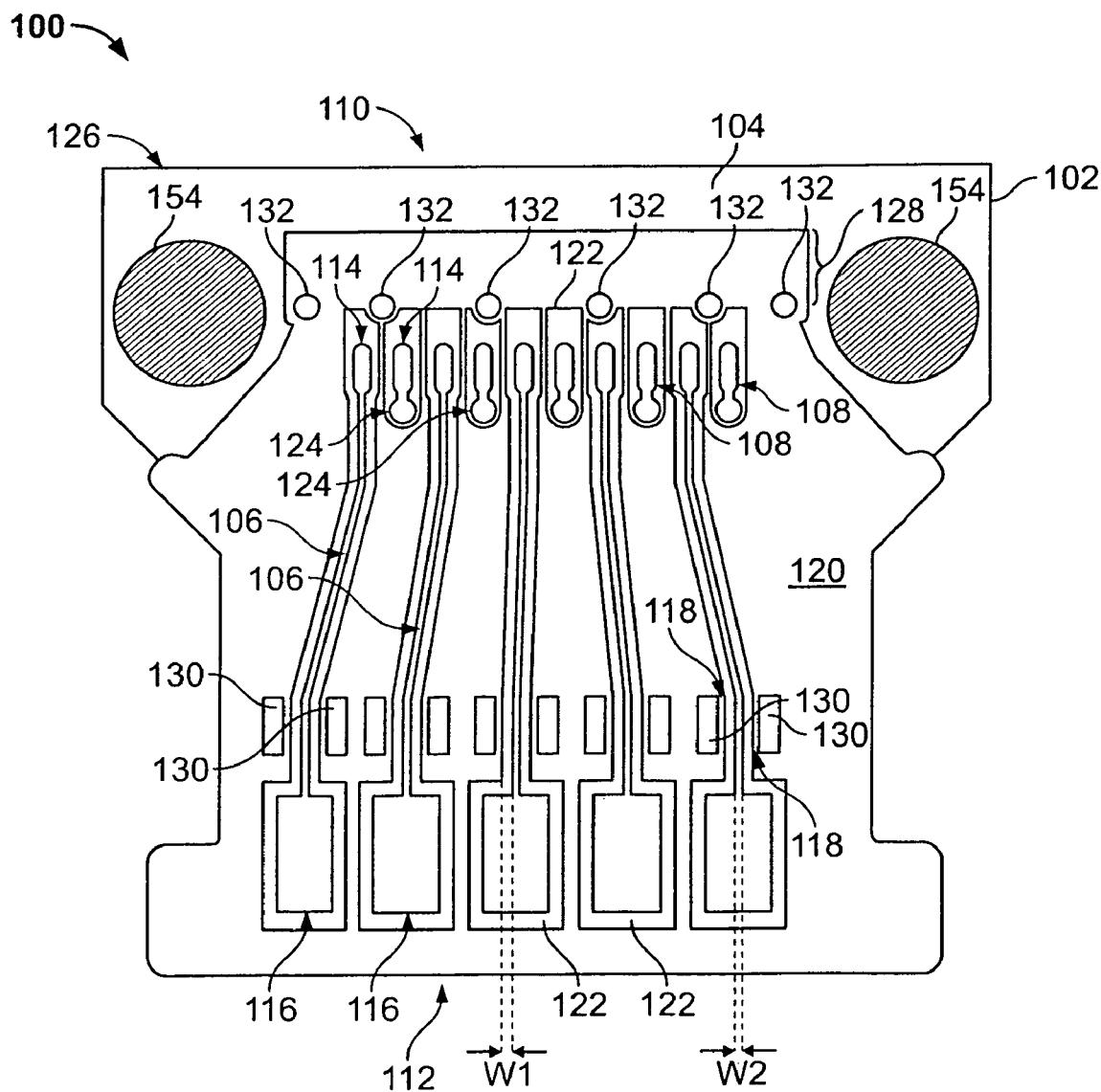
FIG. 1 illustrates a top layer of a transition circuit board which may be used to transition a cable to a connector in accordance with an embodiment of the present invention

FIG. 1 illustrates a top layer 126 of a transition circuit board 100 which may be used to transition a cable to a connector which may not have an internal ground reference. The cable may be one or more ribbonized coaxial cables, although other types of cable may also be used. The circuit board 100 may be formed with layers which are further discussed below, such as one or more internal or intermediate layers and top and bottom outer layers. One or both of the top and bottom outer layers may convey signals between the cable and the connector and have a coplanar ground plane. Optionally, intermediate layers of the circuit board 100 may be ground planes. Holes 154 may extend through the circuit board 100 to be used when mounting the circuit board 100 to another structure.

An outer edge 102 forms a perimeter around the circuit board 100. A cable receiving end 110 receives the coaxial or other cable (not shown). On an opposite side of the circuit board 100, contact mating end 112 receives insulation displacement contact pins (IDC pins) of an insulation displacement connector (not shown). The contact mating end 112 may alternatively be configured to receive contacts of a different type of connector which may not have an internal ground reference.

The top layer 126 may be formed of a dielectric material, such as fiberglass, and has an outer surface 104 provided thereon. Conductive material, such as copper, is provided on the outer surface 104 to form circuit traces to convey signals or grounds between the cable and connector. Conductive material is also provided on the outer surface 104 to form a ground plane with ground links.

A first set of circuit traces 106 extends along the outer surface 104 from the cable receiving end 110 to the contact mating end 112. A second set of circuit traces 108 extends along the outer surface 104 in an area proximate the cable receiving end 110. Circuit traces within the first and second sets of circuit traces 106 and 108 alternate with one another. Each of the circuit traces 106 and 108 has a cable pad 114 for receiving a center conductor of the coaxial cable. A separate center conductor may be soldered to each cable pad 114. Each circuit trace 108 connects to a via 124 which is plated through to the bottom layer (FIG. 2) of the circuit board 100, and thus is electrically connected to a corresponding circuit trace on the bottom layer of the circuit board 100. At the contact mating end 112 of the first set of circuit traces 106, each contact pad 116 is configured to receive a connector contact (not shown), such as an IDC pin. Each IDC pin may be soldered to a respective contact pad 116.

A ground plane 120 is formed on the outer surface 104 of the circuit board 100 and is therefore coplanar with the circuit traces 106 and 108. The ground plane 120 may also be referred to as a ground trace or a ground area and may change in width along the length of the circuit board 100. Coplanar construction may be accomplished as illustrated in FIG. 1, that is, with reference grounds on either side of the circuit traces 106 and 108. Circuit trace apertures 122 are formed around, and electrically separate the ground plane 120 from, the circuit traces 106 and 108, cable pads 114 and contact pads 116.

Coaxial cables typically are provided with a braid or outside shield which, if more than one coaxial cable is being used, may be soldered together to form a single bar or rectangle. The coaxial cable(s) are then soldered to a ground bar acceptance area 128 of the ground plane 120 proximate the cable receiving end 110. Vias 132 connect the ground plane 120 with a ground plane on the bottom layer of the circuit board 100.

Ground plane apertures 130 may be formed in the ground plane 120 proximate the circuit trace apertures 122 of each of the first set of circuit traces 106. A ground link 118 is formed between each of the ground plane apertures 130 and the circuit trace apertures 122 and is electrically connected with the ground plane 120. The circuit trace apertures 122 are separated from the circuit traces 106 and 108 by a distance that may be set to control impedance. By way of example, a width W1 of the circuit trace aperture 122 which separates each of the ground links 118 from the associated circuit trace 106 may be approximately the same as a width W2 of the circuit trace 106. Although the circuit traces 106 are illustrated as straight lines, the circuit traces 106 may also curve, wherein the ground links 118, ground plane apertures 130, and the ground plane 120 follow the contour of the circuit traces 106.

Each of the circuit traces 106 may be designated to convey either signal or a reference ground. To render a circuit trace 106 electrically common with the ground plane 120, the circuit trace 106 may be electrically joined with the respective ground links 118 located to either side using a conductive jumper material, such as solder. Therefore, the circuit board 100 can be easily "programmed" or customized by the user.

The ground plane apertures 130 provide a thermal limitation by limiting the transfer of heat to the ground plane 120 when solder is applied to the corresponding circuit trace 106 and ground link 118. Alternatively, the ground plane 120 may be formed without the ground plane apertures 130. In this configuration, the ground link 118 is not limited in size by the ground plane aperture 130, and may instead be defined by an aperture in a solder mask (FIG. 5) which is discussed below.

Optionally, one or more additional ground planes that are not coplanar with the circuit traces 106 and 108 may be formed within the circuit board 100. The additional ground planes may be used to facilitate small changes to the impedance within portions of the circuit board 100 to maintain signal integrity.

Figure 2:
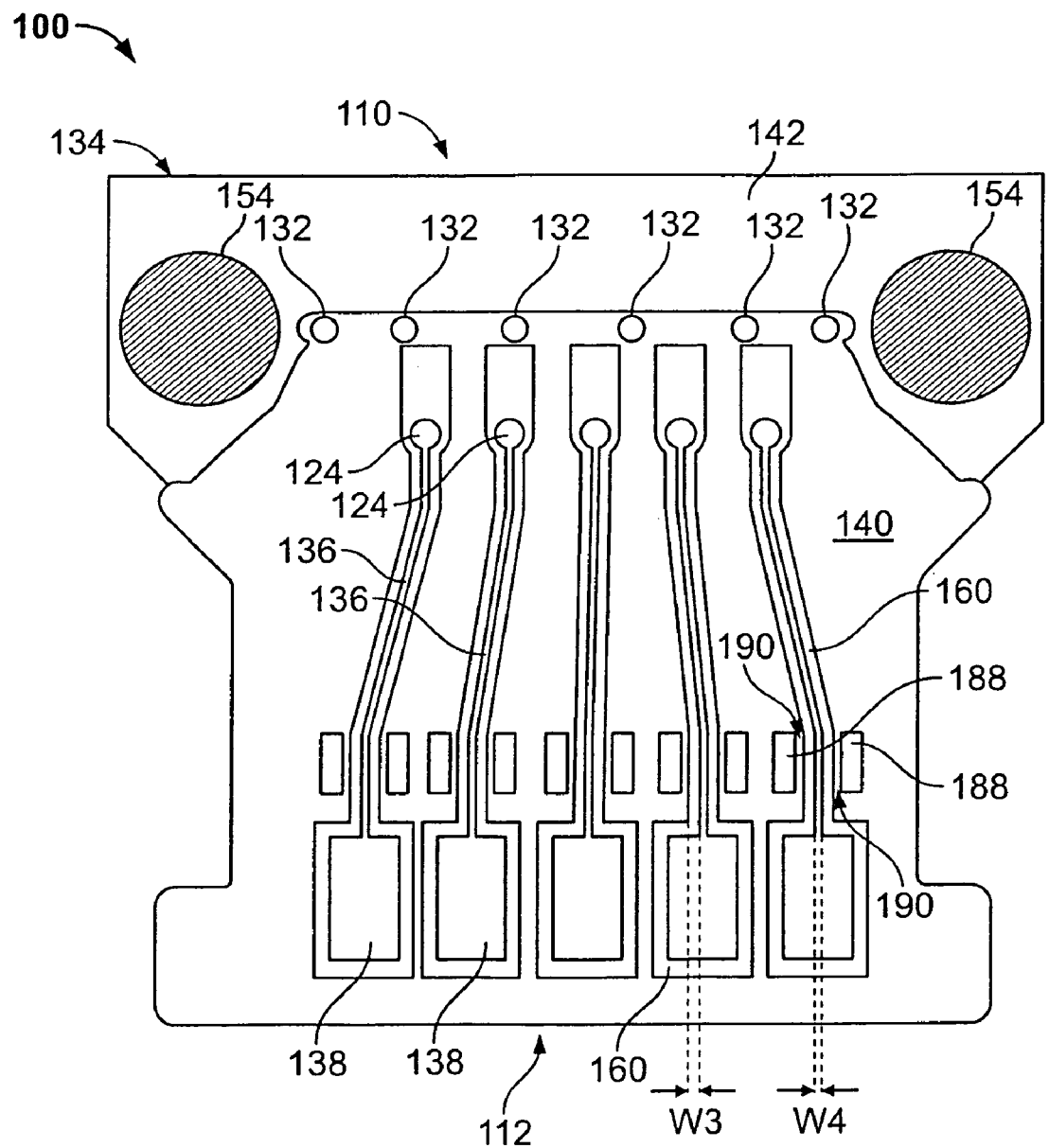
FIG. 2 illustrates a bottom layer of the circuit board of FIG. 1 in accordance with an embodiment of the present invention.

FIG. 2 illustrates a bottom layer 134 of the circuit board 100 with an outer surface 142. A set of circuit traces 136 and a ground plane 140 are formed on the outer surface 142 and are coplanar with one another. The circuit traces 136 extend from the vias 124 to contact pads 138 proximate the contact mating end 112. Each contact pad 138 is configured to receive a connector contact (not shown), such as an IDC pin. The vias 132 electrically connect the ground plane 140 with the ground plane 120 of the top layer 126.

Figure 6:
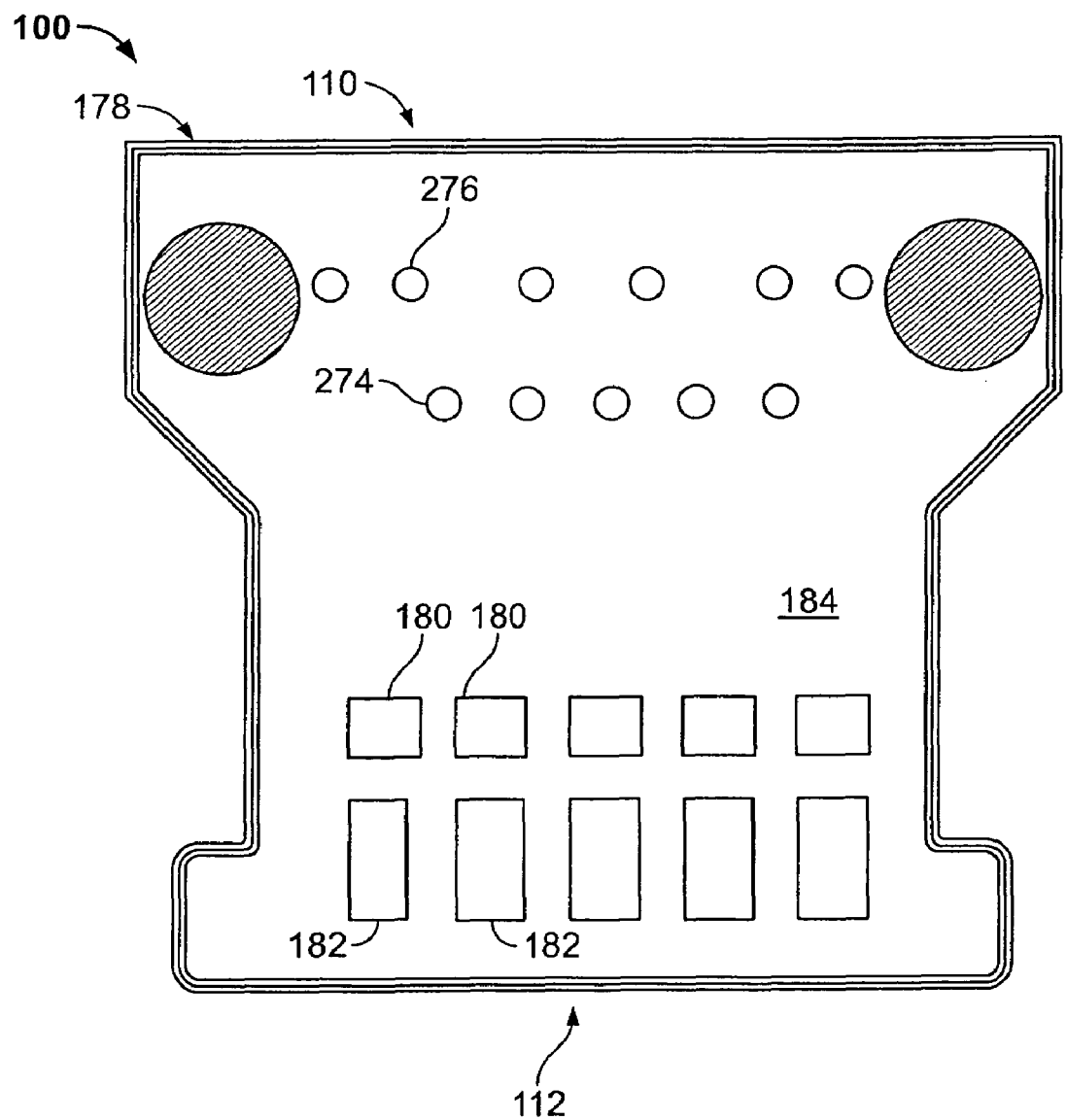
FIG. 6 illustrates a bottom solder mask which is applied over the bottom layer of FIG. 2 in accordance with an embodiment of the present invention.

Circuit trace apertures 160 are provided around and electrically separate the ground plane 140 from the circuit traces 136, vias 124 and contact pads 138. Ground plane apertures 188 may be formed in the ground plane 140 proximate the circuit traces 136 to provide a thermal limitation as discussed above with the ground plane apertures 130 (FIG. 1). In this configuration, a ground link 190 which is electrically connected with the ground plane 140 is formed between each of the ground plane apertures 188 and the circuit trace apertures 160. The circuit trace aperture 160 may have a width W3 separating each of the ground links 190 from the associated circuit trace 136, which is approximately the same as a width W4 of the circuit trace 136. Alternatively, the ground plane 140 may be formed without the ground plane apertures 188 whereby the ground links 190 may be defined by apertures in a solder mask (FIG. 6).

An insulation displacement connector (not shown) has two rows of IDC pins which are offset or staggered with respect to each other. Therefore, the contact pads 138 are offset with respect to the contact pads 116 on the top layer 126. The IDC pins are pressed over the contact mating end 112 of the circuit board 100 with a first row of IDC pins interfacing with the contact pads 116 on the top layer 126 (FIG. 1) and a second row of IDC pins interfacing with the contact pads 138 on the bottom layer 134.

Figure 3:
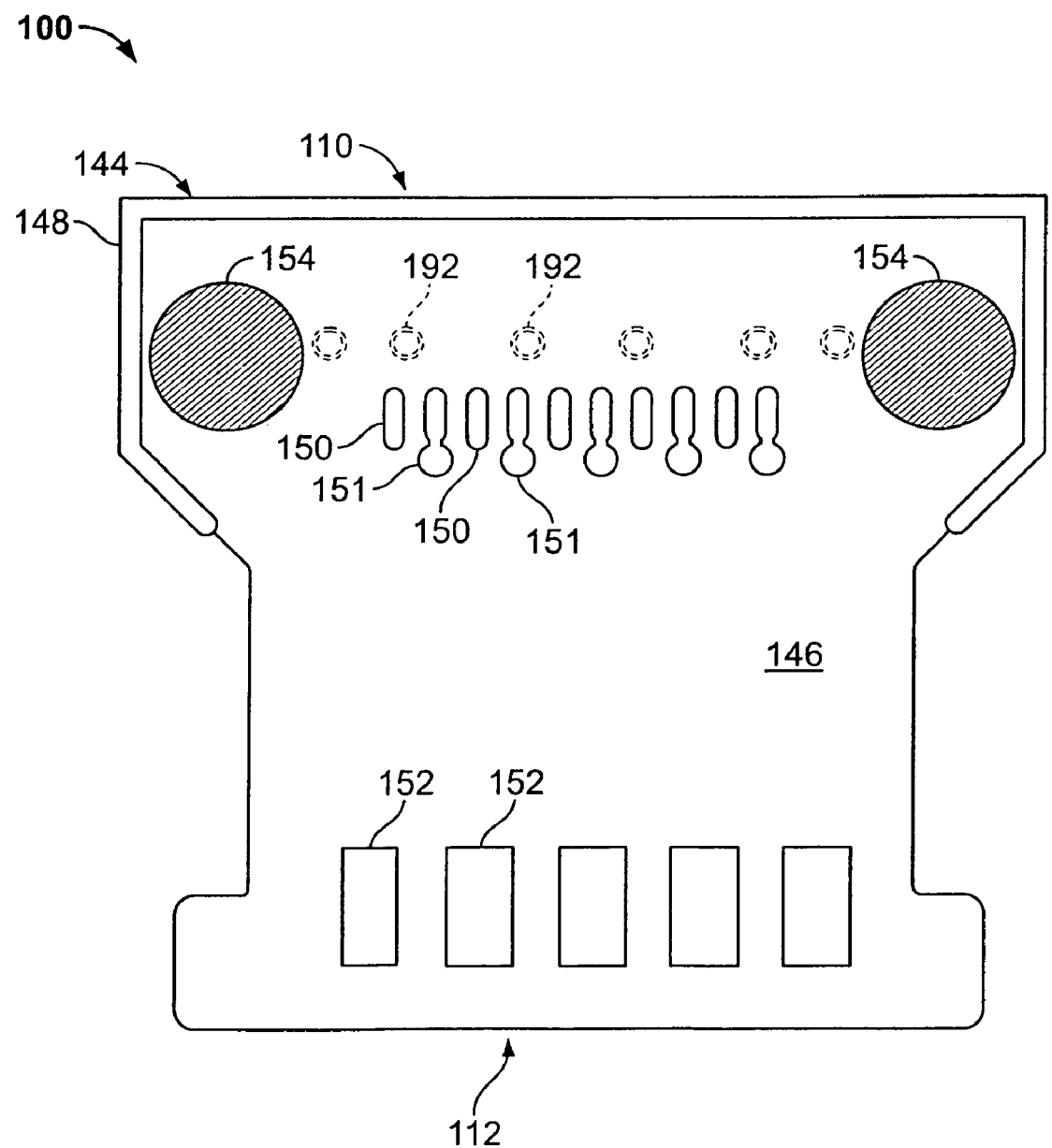
FIG. 3 illustrates a first ground plane formed as an intermediate layer of the circuit board of FIG. 1 in accordance with an embodiment of the present invention.
Figure 4:
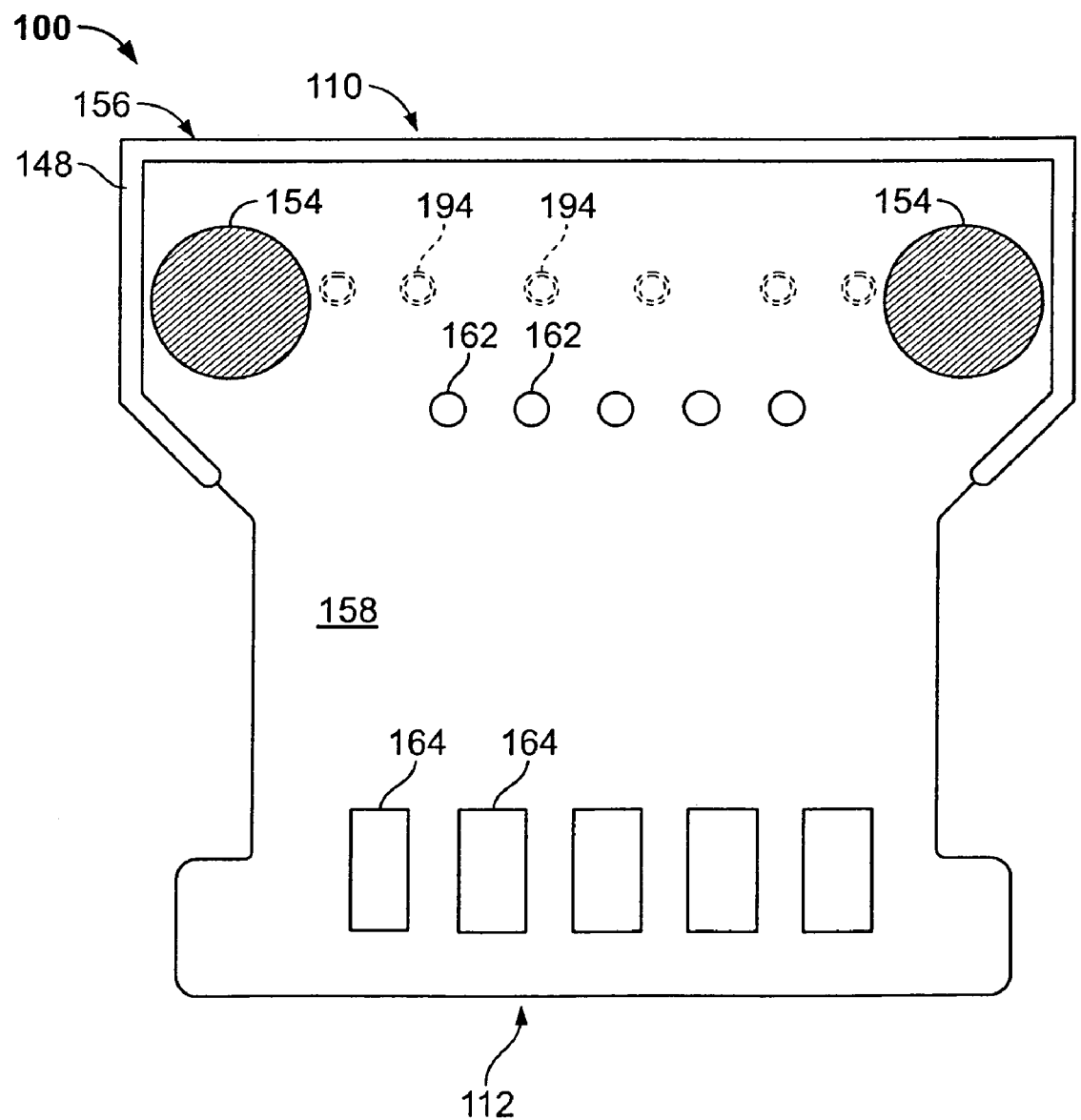
FIG. 4 illustrates a second ground plane formed as an intermediate layer of the circuit board of FIG. 1 in accordance with an embodiment of the present invention.

FIG. 3 illustrates a first ground plane 144 formed as an intermediate layer of the circuit board 100. The first ground plane 144 may be formed as a layer of conductive material 146 over a layer of dielectric material 148 which operates as a filler to separate the first ground plane 144 from a second ground plane (FIG. 4). The plated through vias 132 (FIG. 1) extend through the first ground plane 144 within broken circles 192 or thermals which allow electrical current to flow but limit the transfer of heat to the first ground plane 144 from another layer.

FIG. 4 illustrates a second ground plane 156 formed as an intermediate layer of the circuit board 100. The second ground plane 156 may be formed of a layer of conductive material 158 which is applied to an opposite side of the dielectric material 148 as compared to the first ground plane 144 (FIG. 3). The plated through vias 132 extend through the second ground plane 156 within broken circles 194 or thermals.

Referring again to FIGS. 1 and 2, the contact pads 116 and 138 are wider than the circuit traces 106 and 108, and therefore the impedance below (or above) the contact pads 116 and 138 is lower than the impedance below (or above) the circuit traces 106 and 108, resulting in undesirable signal reflection. The impedance of the wider contact areas can be increased by reference to one of the ground planes within the circuit board 100. For example, the first ground plane 144 (FIG. 3) may provide a ground reference level for portions of the bottom layer 134 (FIG. 2) while the second ground plane 156 (FIG. 4) may provide a ground reference level for portions of the top layer 126 (FIG. 1). The location of the first and second ground planes 144 and 156 with respect to the desired outer layer may be determined based on the desired change in impedance. It should be understood that the first ground plane 144 may provide a ground reference for the top layer 126 while the second ground plane 156 may provide a ground reference for the bottom layer 134. In addition, portions of one layer may reference the first ground plane 144, while other portions of the same layer may reference the second ground plane 156.

In FIG. 3, the conductive material 146 is removed from, or not applied to, areas 152 which correspond to contact pads 116 on the top layer 126 which are wider than the circuit traces 106, allowing the wider contact areas to reference the second ground plane 156 (FIG. 4). The conductive material 146 is also removed from the areas 150 which correspond to the cable pads 114 of the circuit traces 106 and areas 151 which correspond to the cable pads 114 and the vias 124 of the circuit traces 108.

In FIG. 4, the conductive material 158 is not applied to areas 164 corresponding to the contact pads 138 on the bottom layer 134 to allow the wider contact areas to reference the first ground plane 144 (FIG. 3). The conductive material 158 is also removed from, or not applied to, areas 162 which surround the vias 124 (FIG. 1). The areas 162 may be circular, square, or other shape.

Figure 5:
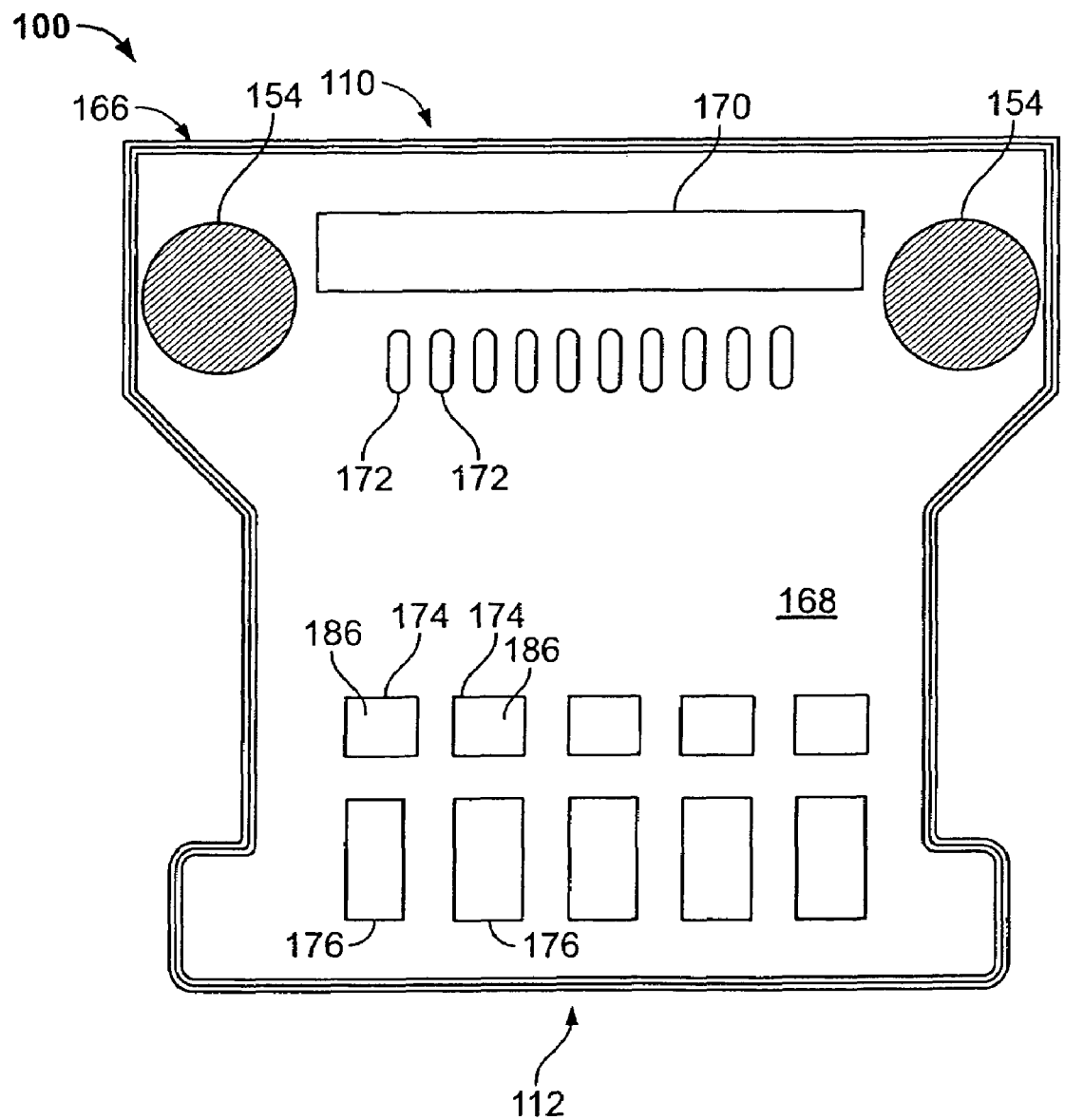
FIG. 5 illustrates a top solder mask which may be applied over the top layer of FIG. 1 in accordance with an embodiment of the present invention.

FIG. 5 illustrates a top solder mask 166 which may be applied over the top layer 126 of FIG. 1. The top solder mask 166 covers portions of the top layer 126 with an insulating coating 168 which prevents solder from adhering to the covered or coated portions. A ground bar mask aperture 170 is formed in the top solder mask 166 to expose the ground bar acceptance area 128 of the ground plane 120. Therefore, the ground bar acceptance area 128 is not coated by the insulating coating 168 and will accept solder when the braid or shield of the coaxial cable is soldered thereto. Similarly, cable pad mask apertures 172 are formed in the top solder mask 166 to expose the cable pads 114. Contact pad mask apertures 176 are formed in the top solder mask 166 to expose the contact pads 116, allowing interconnection with the IDC pins.

Circuit trace mask apertures 174 are formed in the top solder mask 166 to expose uncoated portions 186 of the circuit traces 106, the ground links 118 and the optional ground plane apertures 130. The uncoated portions 186 accept solder or other conductive jumper material that may be applied within the circuit trace mask apertures 174 to render select circuit traces 106 electrically common with the ground plane 120. The circuit trace mask aperture 174 may be positioned to expose both ground links 118 on either side of the circuit trace 106, or to expose a single ground link 118 on one side of the circuit trace 106. Optionally, when the ground plane apertures 130 are not used, the circuit trace mask apertures 174 may expose a portion of the ground plane 120 which defines an area of the ground link 118. Each circuit trace mask aperture 174 is at least partially surrounded by coated portions of the top layer 126, and therefore adjacent circuit traces which carry signals will not be inadvertently tied to the ground plane 120.

Thus, the desired circuit traces 106 may be linked to the ground plane 120 to obtain a configuration based on an application in which the circuit board 100 is to be used. For example, two different applications may require different pins to be connected to ground. The circuit board 100 can be customized for both applications by linking different circuit traces 106 to the ground plane 120.

FIG. 6 illustrates a bottom solder mask 178 which is applied over the bottom layer 134 of FIG. 2. The bottom solder mask 178 covers portions of the bottom layer 134 with an insulating coating 184 which prevents solder from adhering to the covered or coated portions.

Bottom trace mask apertures 180 are formed to expose the circuit traces 136, the ground links 190, and the ground plane apertures 188, if used. Conductive material may be applied within one or more of the bottom trace mask apertures 180 to render a desired circuit trace 136 electrically common with the ground plane 140. Bottom contact pad mask apertures 182 leave the contact pads 138 uncoated by the insulating coating 184, allowing connection with the IDC pins.

Via apertures 274 and 276 are formed to expose the vias 124 and 132, respectively. The via apertures 274 and 276 allow venting when heat is applied to the circuit board 100, preventing steam pressure from building and possibly delaminating one or more layers of the circuit board 100.

Figure 7:
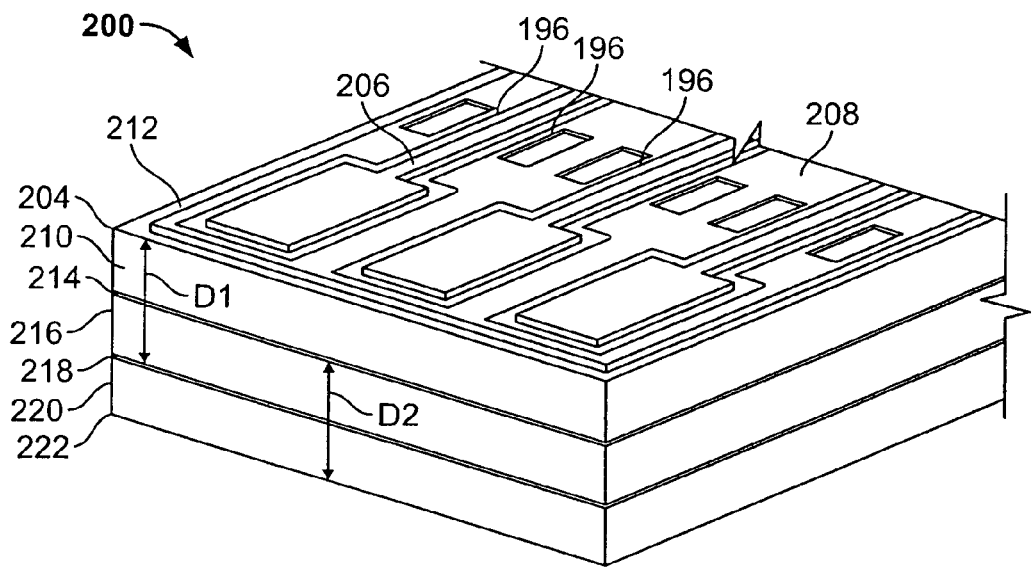
FIG. 7 illustrates a multilayer circuit board which may be used to transition a cable to a connector which does not have an internal ground reference in accordance with an embodiment of the present invention.
Figure 8:
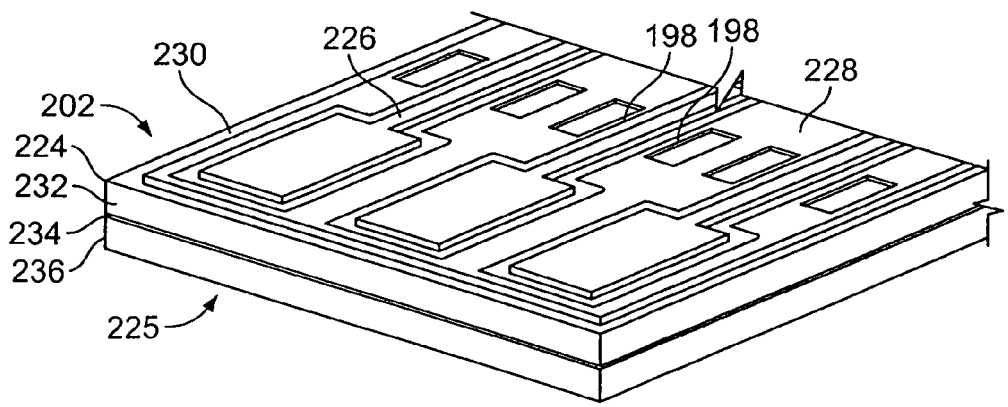
FIG. 8 illustrates an alternative multilayer circuit board which may be used to transition a cable to a connector which does not have an internal ground reference in accordance with an embodiment of the present invention.

FIGS. 7 and 8 illustrate multilayer circuit boards 200 and 202 which may be used to transition a cable to a connector which does not have an internal ground reference. The circuit board 200 has four conductive layers and the circuit board 202 may have one, two or three conductive layers. The conductive layers may be formed of copper.

Turning to the circuit board 200 of FIG. 7, the four conductive layers may be formed by seven layers of lamination. Top layer 204 is the first conductive layer in the circuit board 200 and has circuit traces 206 and ground plane 208 formed on an outer surface 212 of dielectric material 210. Ground links 196 are connected to the ground plane 208. The solder mask, such as top solder mask 166 (FIG. 5) which is coated over portions of the circuit traces 206, ground plane 208 and outer surface 212 is not typically considered a separate layer.

A first ground plane 214 is the second conductive layer in the circuit board 200 and is laminated on a bottom side of the dielectric material 210. Dielectric material 216 is applied between the first ground plane 214 and second ground plane 218, which is the third conductive layer in the circuit board 200. The first and second ground planes 214 and 218 are intermediate layers within the circuit board 200. Dielectric material 220 separates the second ground plane 218 and bottom layer 222, which is the fourth conductive layer in the circuit board 200. Circuit traces, ground plane and ground links (not shown) are formed on an outer surface of the bottom layer 222 as in FIG. 2. The bottom solder mask 178 (FIG. 6) is coated over portions of the circuit traces, ground plane and the outer surface of the bottom layer 222.

The first ground plane 214 may provide a ground reference for portions of the bottom layer 222 while the second ground plane 218 provides a ground reference for portions of the top layer 204. The top layer 204 and the second ground plane 218 are separated by a distance D1 based on the desired impedance of the wider contact areas as discussed previously, such as the contact pads 116 of FIG. 1. The bottom layer 222 and the first ground plane 214 are separated by a distance D2 based on the desired impedance.

Turning to FIG. 8, the circuit board 202 is illustrated as having three conductive layers formed by five layers of lamination. Alternatively, the circuit board 202 may have one conductive layer formed by two layers of lamination or two conductive layers which may be formed by three or four layers of lamination. Top layer 224 is the first conductive layer in the circuit board 202 and has circuit traces 226, ground links 198 and ground plane 228 formed on an outer surface 230 of dielectric material 232. The top solder mask 166 (FIG. 5) is coated over portions of the circuit traces 226, ground plane 228 and the outer surface 230. An optional ground plane 234 may be a second conductive layer in the circuit board 202. The ground plane 234 may provide a ground reference level for portions of the top layer 224. In one embodiment, wherein the circuit board 202 has two conductive layers, the ground plane 234 is located on a back surface 225 of the circuit board 202 that is opposite to the top layer 224. Optionally, dielectric material 236 may be formed on an opposite side of the ground plane 234 (fourth layer of lamination) to prevent shorting the ground plane 234 to other structures. In another embodiment, circuit traces, ground links, and a ground plane (not shown) may be formed on the back surface 225, forming the third conductive layer.

Figure 9:
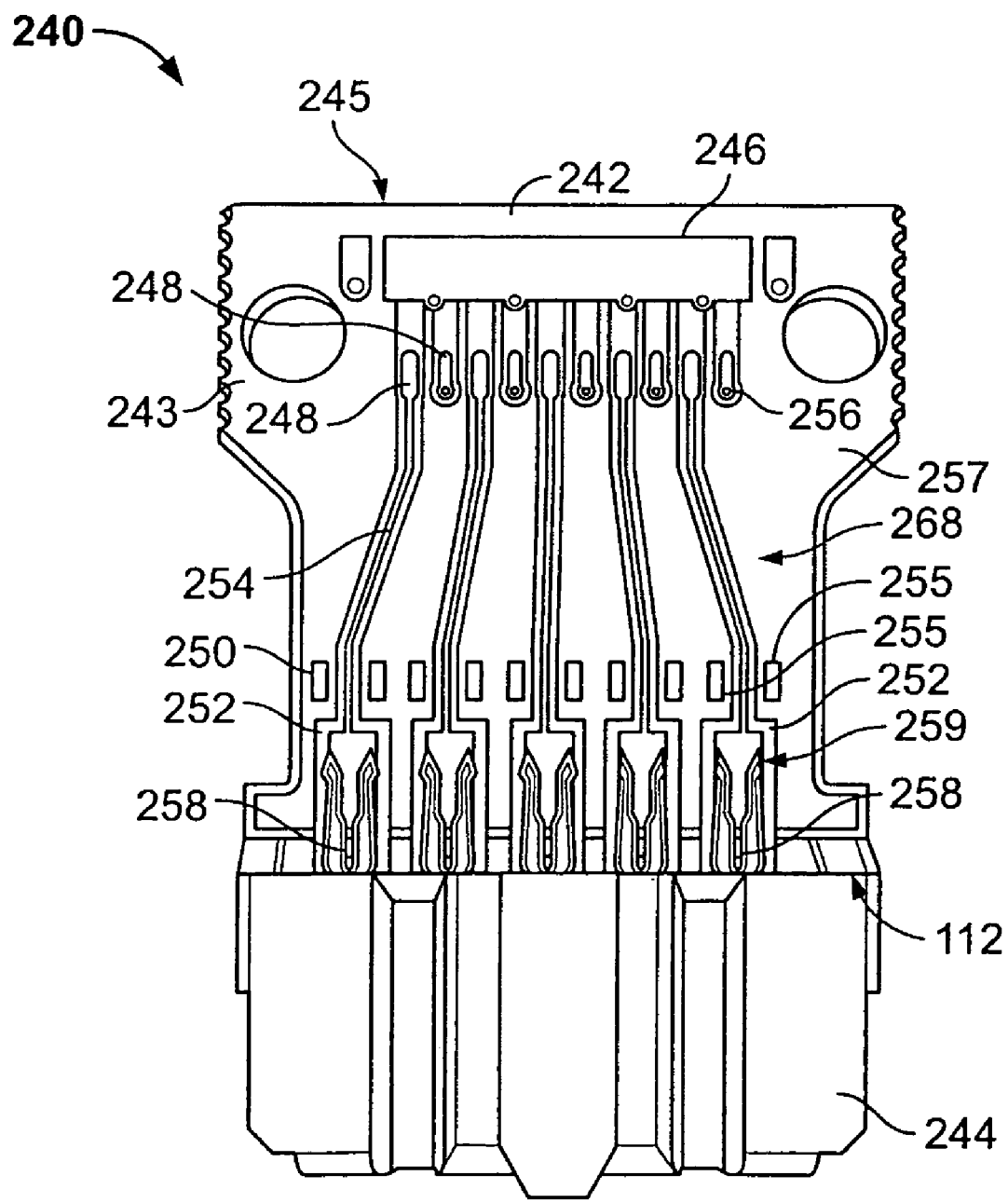
FIG. 9 illustrates an assembly of a circuit board and an insulation displacement connector which has been pressed thereon in accordance with an embodiment of the present invention.

FIG. 9 illustrates an assembly 240 of a circuit board 242 and an insulation displacement connector 244 which has been pressed thereon. Top layer 245 of the circuit board 242 is illustrated with insulating coating 268 coated over portions of circuit traces 254, vias 256 and ground plane 257. The circuit traces 254 and ground plane 257 are coplanar.

The insulating coating 268 forms a top solder mask as discussed previously in relation to the top solder mask 166 of FIG. 5. Different manufacturing methods known in the art may be used to form the top solder mask. For example, the insulating coating 268 may be a photo-imagable solder mask which may be cured by application of light, such as an ultraviolet light. The insulating coating 268 may be applied over the entire outer surface 243. Portions of the outer surface 243 are then covered to prevent exposure to the light. Covered portions may be first, second, third and fourth portions 246, 248, 250 and 252 which correspond to the ground bar mask aperture 170 (FIG. 5), the cable pad mask apertures 172, the circuit trace mask apertures 174, and the contact pad mask apertures 176, respectively. The covered portions are not exposed to the light and thus are not cured. After the application of light has cured the desired coated portions, the insulating coating 268 may be rinsed off or otherwise removed from the outer surface 243, leaving the first, second, third and fourth portions 246, 248, 250, and 252 uncoated by the insulating coating 268. The uncoated portions may receive and retain solder, wherein the coated portions do not retain solder.

Alternatively, the first, second, third and fourth portions 246, 248, 250, and 252 may be covered with a mask or masking agent prior to coating the outer surface 243 with the insulating coating 268. In another embodiment, the insulating coating 268 may be screen printed onto desired areas of the outer surface 243.

After the insulating coating 268 has been applied, the circuit board 242 may be configured or programmed to be used in a particular application. Solder paste may be directly applied, or applied and then reflowed, to one or more of the third portions 250 to electrically connect the desired circuit trace 254 to one or more associated ground links 255 which are electrically connected to the ground plane 257.

The insulation displacement connector 244 may be pressed over the contact mating end 112 of the circuit board 242. Bifurcated IDC pins 258 extend over contact pads 259, which are not coated with the insulating coating 268. The IDC pins 258 may then be soldered to the contact pads 259.

Figure 10:
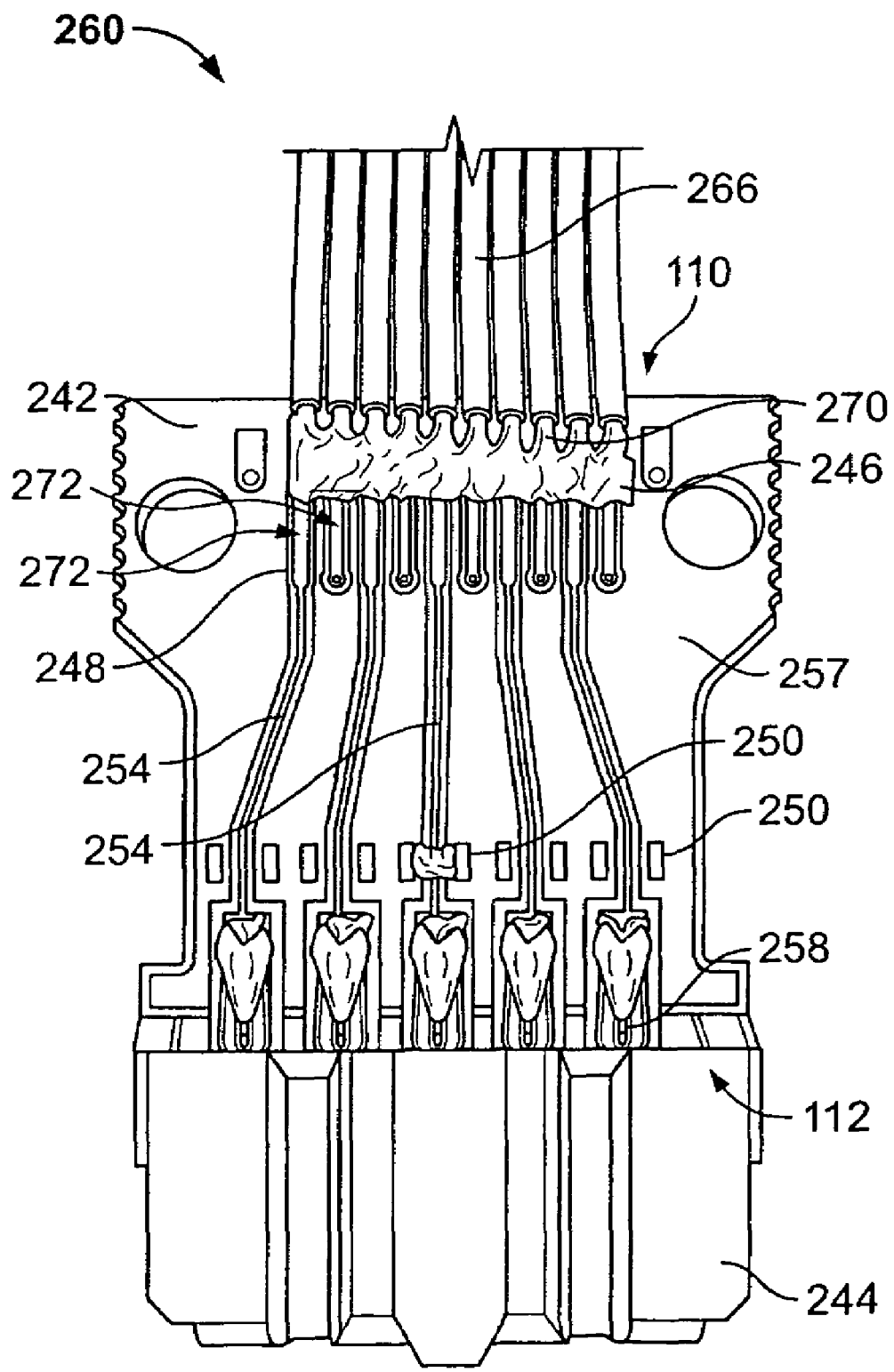
FIG. 10 illustrates an assembly of the circuit board of FIG. 9 with an insulation displacement connector and ribbonized coaxial cable interconnected thereto in accordance with an embodiment of the present invention.

FIG. 10 illustrates an assembly 260 of the circuit board 242 of FIG. 9 with the insulation displacement connector 244 and a ribbonized coaxial cable 266 interconnected thereto. The circuit board 242 has been programmed by applying solder or other conductive material within one of the third portions 250 (corresponding to the circuit trace mask aperture 174) to connect the circuit trace 254 to ground.

To interconnect the coaxial cable 266 to the circuit board 242, a braid or outer shield 270 of the coaxial cable 266 is soldered to the first portion 246 proximate the cable receiving end 110 which was not covered with the insulating coating 268. Center conductors 272 of the coaxial cable 266 are soldered to the second portion 248. The insulation displacement connector 244 is pressed over the contact mating end 112 of the circuit board 242, and the bifurcated IDC pins 258 extend over, and are soldered to, contact pads accessible through the fourth portion 252.

While the invention has been described in terms of various specific embodiments, those skilled in the art will recognize that the invention can be practiced with modification within the spirit and scope of the claims.

What is claimed is:

1. A method of manufacturing a circuit board for transitioning a coaxial cable to a connector, comprising:
   forming a circuit board with at least two layers;
   providing a circuit trace on an outer surface of the circuit board, the circuit trace having a cable pad and a contact pad at different ends of the outer surface;
   providing a ground plane on the outer surface of the circuit board, the ground plane having a ground link and being coplanar with the circuit trace;
   coating at least portions of the circuit trace and the outer surface of the circuit board with an insulating coating;
   masking a portion of the circuit trace and the ground link to form an uncoated portion of the circuit trace and the ground link, the circuit trace and the ground link within the uncoated portion being located immediately adjacent to one another; and
   bonding a conductive jumper material to the uncoated portion of the circuit trace and the ground link to render the circuit trace electrically common with the ground plane.

2. The method of claim 1, wherein the jumper material comprises solder that shorts the circuit trace to the ground link within the uncoated portion.

3. The method of claim 1, further comprising providing multiple circuit traces on the outer surface of the circuit board and bonding a conductive jumper material to the uncoated portion of a select one of the circuit traces and a corresponding ground link based on an application in which the circuit board is to be used.

4. The method of claim 3, wherein the jumper material comprises solder that shorts the circuit trace to the ground link within the uncoated portion.

5. The method of claim 1, wherein the circuit board has a cable receiving end and a contact mating end, the cable receiving end being configured to be joined to cables terminated at the circuit board, the contact mating end being configured to engage contacts.

6. The method of claim 1, further comprising providing a second ground plane separate from the ground plane and wherein the second ground plane is electrically common with the ground plane.

7. The method of claim 1, wherein the ground link further comprising a first ground link extending along a first side of the circuit trace within the uncoated portion and a second ground link extending along a second side of the circuit trace within the uncoated portion.

8. The method of claim 1, wherein the ground plane follows a contour of at least one of the circuit trace, cable pad and contact pad.

* * * * *